(12) United States Patent
Tsai et al.

(10) Patent No.: US 8,378,717 B1
(45) Date of Patent: Feb. 19, 2013

(54) HIGH-SPEED BICMOS DOUBLE SAMPLING TRACK-AND-HOLD AMPLIFIER CIRCUIT

(75) Inventors: Shun-Hung Tsai, Kaohsiung (TW); Hung-Yi Lin, Kaohsiung (TW)

(73) Assignee: National Taipei University of Technology, Taipei (TW)

( * ) Notice: Subject to any disclaimer, the term of this patent is extended or adjusted under 35 U.S.C. 154(b) by 0 days.

(21) Appl. No.: 13/295,279

(22) Filed: Nov. 14, 2011

(51) Int. Cl.
*G11C 27/02* (2006.01)
*H03K 5/00* (2006.01)
(52) U.S. Cl. .......................................... 327/95
(58) Field of Classification Search ............... 327/91–97; 341/122–126
See application file for complete search history.

(56) References Cited

U.S. PATENT DOCUMENTS

| | | | |
|---|---|---|---|
| 5,017,924 A * | 5/1991 | Guiberteau et al. | 342/195 |
| 5,872,470 A * | 2/1999 | Mallinson et al. | 327/94 |
| 6,628,148 B2 * | 9/2003 | Shirasaki | 327/95 |
| 7,088,277 B2 * | 8/2006 | Kobayashi et al. | 341/155 |

* cited by examiner

*Primary Examiner* — Quan Tra
(74) *Attorney, Agent, or Firm* — Ming Chow; Sinorica, LLC (57) ABSTRACT

A high-speed BiCMOS double sampling track-and-hold amplifier circuit, comprising an input buffer, two front-end switches, two sampling capacitors, two intermediate buffers, two feedback buffers, two back-end switches and an output buffer. The present invention forms a hold circuit featuring BiCMOS double sampling through the aforementioned components so as to reduce complexities in designing the sampling circuit and the output buffer within the BiCMOS track-and-hold amplifier circuit by means of double sampling, thereby increasing the effective sampling rate to two times. Additionally, the high-speed BiCMOS double sampling track-and-hold amplifier circuit according to the present invention further employs the linearization technology to enhance the linearity of the input buffer in the BiCMOS double sampling track-and-hold amplifier circuit in order to improve the dynamic response of the integral BiCMOS double sampling track-and-hold amplifier circuit.

9 Claims, 13 Drawing Sheets

HIGH-SPEED BICMOS DOUBLE SAMPLING TRACK-AND-HOLD AMPLIFIER CIRCUIT

BACKGROUND OF THE INVENTION

1. Field of the Invention

The present invention generally relates to a high-speed BiCMOS double sampling track-and-hold amplifier circuit; in particular, the present invention relates to a double sampling track-and-hold amplifier circuit combining the advantages of high transduction and double sampling offered by BiCMOS. The present invention uses the approach of double sampling to reduce complexities in designing the sampling circuit and the output buffer within the BiCMOS track-and-hold amplifier circuit thereby increasing the effective sampling rate to two times.

2. Description of Related Art

At present, the development of portable electronic products keeps devoting efforts in fulfilling goals of multiple functions, low power consumption, reduced costs and miniaturization in size, thus leading to the emergence of single-chip system concept, and relevant technologies now become considerably mature as well. In most of current single-chip systems the analog-to-digital converter is an indispensible component, and the analog-to-digital converter architecture may vary with regards to different applications and purposes.

In an analog-to-digital converter, the most critical unit should be the track-and-hold amplifier (THA) circuit. A well-designed track-and-hold amplifier circuit can not only elevate dynamic performance of the analog-to-digital converter, but extensively compress undesirable influences caused by clock skew and clock jitter problems of clock signals on the analog-to-digital converter.

Common track-and-hold amplifier circuits can be largely classified into of closed-circuit type and open-circuit type. Herein, the advantage of the closed-circuit architecture lies in high resolution, but it is inoperable under high frequency state. Consequently, the key consideration in applications of closed-circuit track-and-hold amplifier circuit is about the issue of circuit stability. But the solution to such an issue may also adversely complicate the design of high-speed track-and-hold amplifier circuit, accordingly consuming more power.

Figure 1:
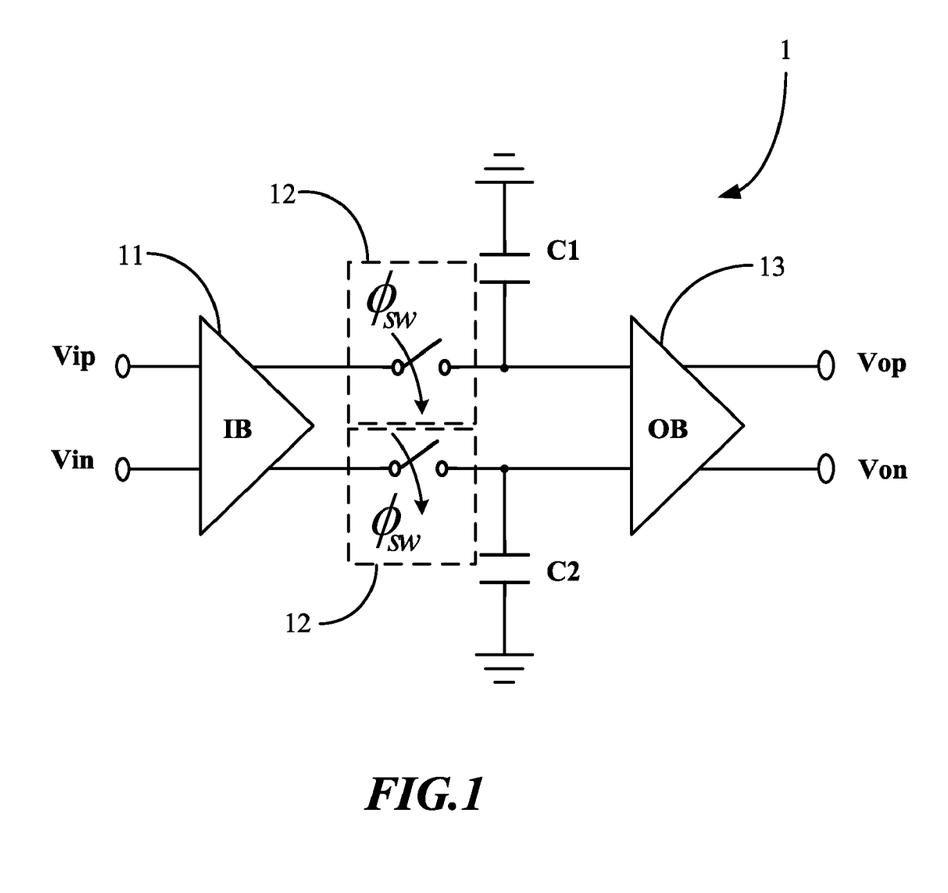
FIG. 1 shows a diagram for the architecture of a conventional fully differential track-and-hold amplifier circuit.
Figure 2:
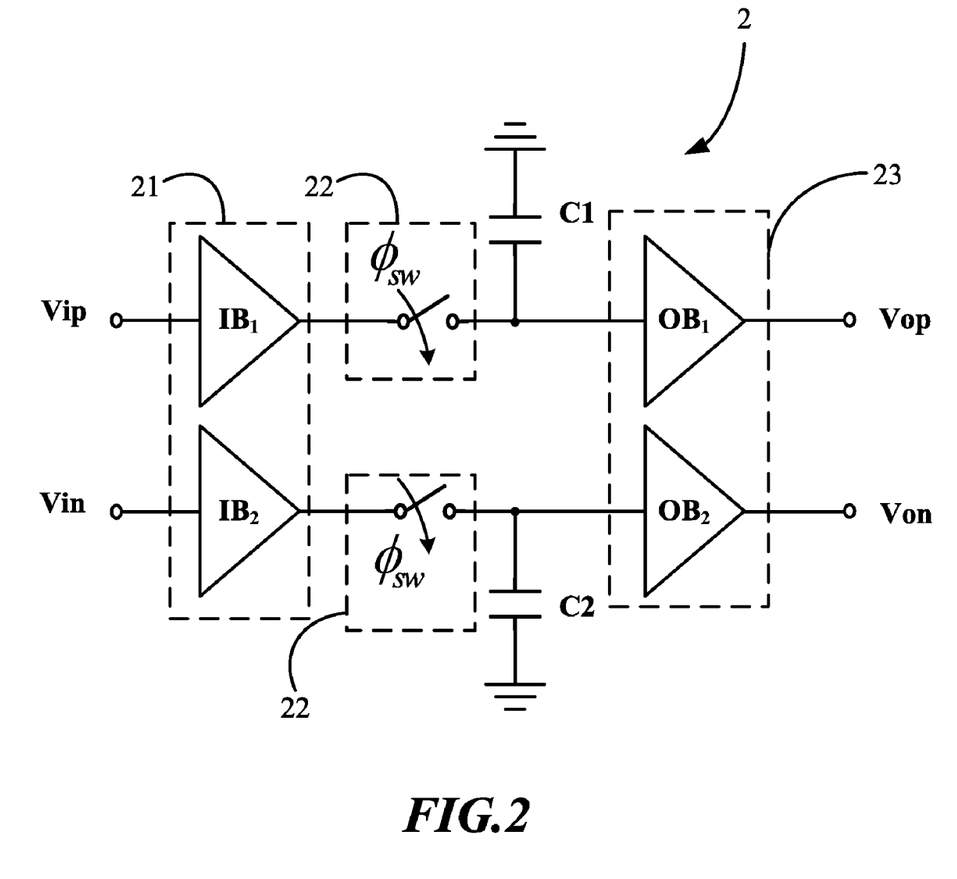
FIG. 2 shows a diagram for the architecture of a conventional fully pseudo-differential track-and-hold amplifier circuit.

As a result, in high-speed domains, it is common to adopt the open-circuit type of architecture. In general, the open-circuit track-and-hold amplifier circuit architecture can be largely categorized as fully differential track-and-hold amplifier circuit and fully pseudo-differential track-and-hold amplifier circuit. It can be seen from FIG. 1 that the fully differential track-and-hold amplifier circuit 1 essentially comprises an input buffer 11 including two input ends and two output ends, two switches 12 and an output buffer 13 including two input ends and two output ends. On the other hand, the fully pseudo-differential track-and-hold amplifier circuit 2 as shown in FIG. 2 mainly comprises two input buffers 21 respectively including one input end and one output end, two switches 22 as well as two output buffers 23 respectively including one input end and one output end.

Figure 3A:
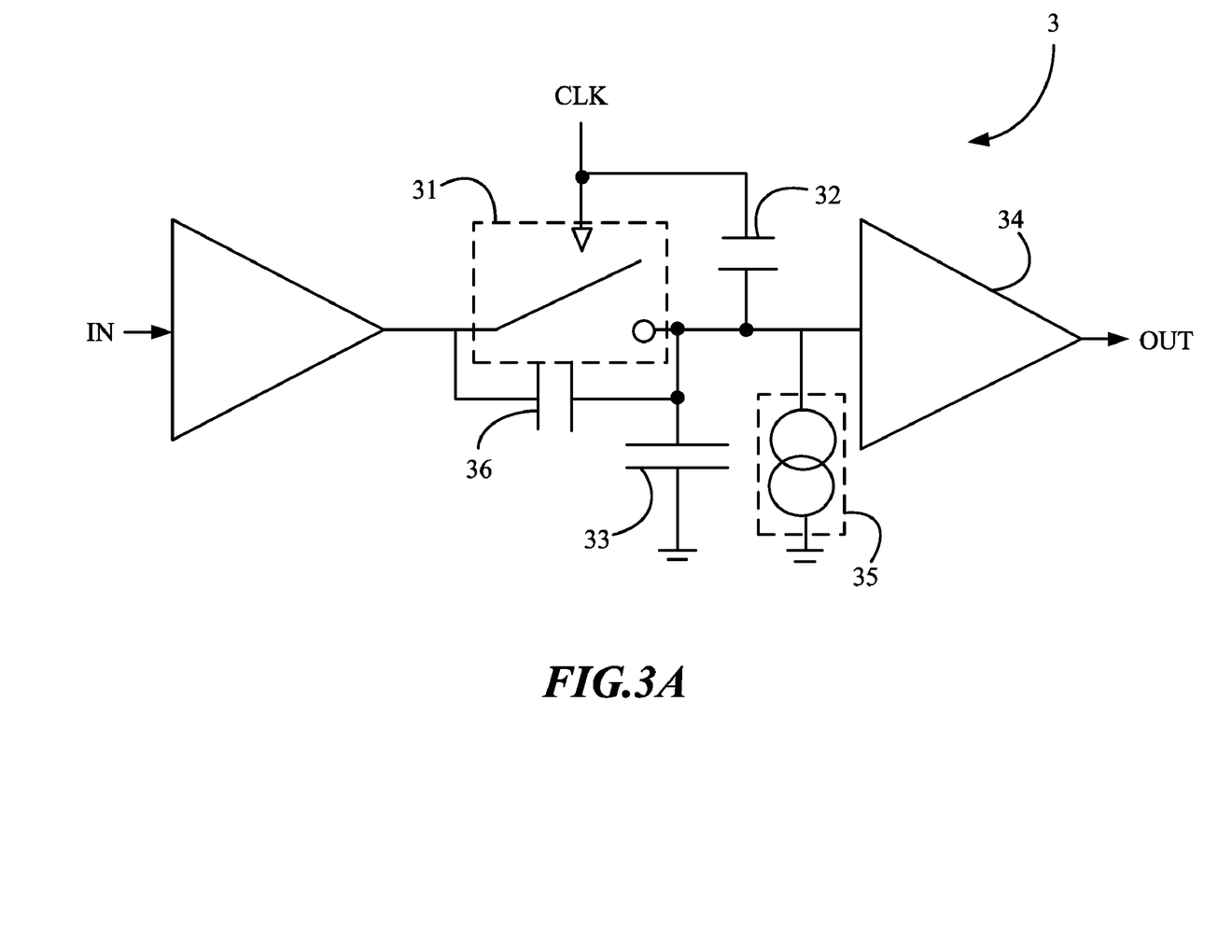
FIG. 3A shows a diagram illustrating three types of non-ideal effects in the conventional track-and-hold amplifier circuit.
Figure 3B:
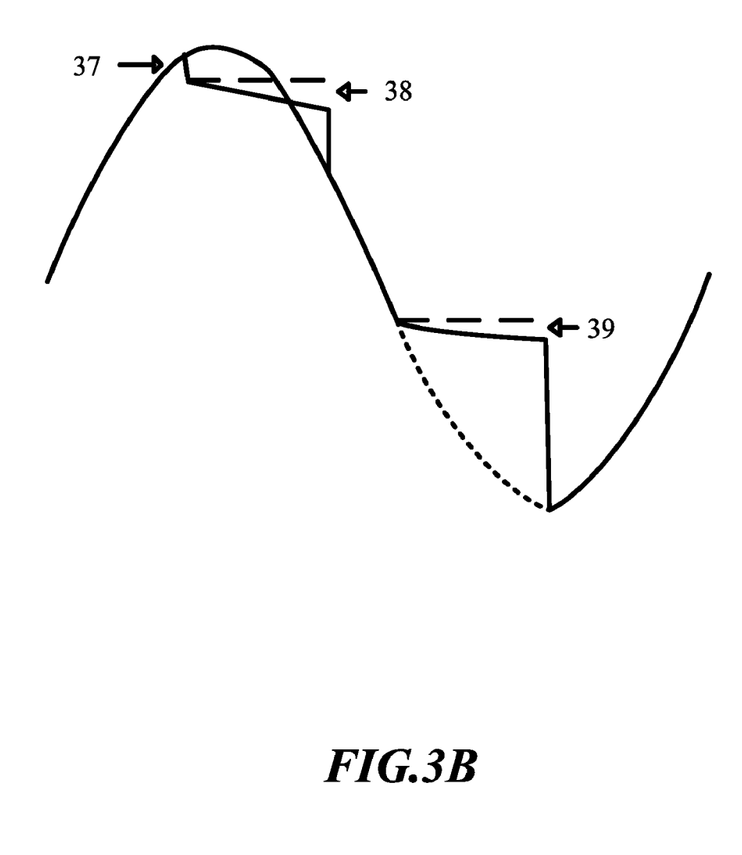
FIG. 3B shows a diagram of output waveforms affected by the non-ideal effects in the conventional track-and-hold amplifier circuit.

However, for actual applications, the track-and-hold amplifier circuit may not be so ideal. The output voltage of an ideal track-and-hold amplifier circuit should be maintained at a constant value, but in fact several non-ideal effects, such as hold mode feedthrough (HMF), pedestal error, droop error and the like, do exist, and all of which may cause the output of the track-and-hold amplifier circuit to fluctuate. In general, there are three major non-ideal effects existing in the track-and-hold amplifier circuit 3. The first one is pedestal error whose transduction pathway is shown in FIG. 3, and it can be been that such an error appears because, as the switch 31 performing connect and disconnect operations, the clock signal passes through the pathway of the stray capacitor 32 and couples to the sampling capacitor 33 used for signal storage. Hence, the amount of electric charge stored in the sampling capacitor 33 is affected, and the influence thereof on the output waveform is illustrated as reference number 37 in FIG. 3B.

The second non-ideal effect is droop error. From its transduction pathway shown in FIG. 3A, it can be seen that such an error occurs because, as the switch 31 performing the disconnect operation, the input impedance of the back-end buffer 34 is not an ideal infinity value but a finite input impedance. Therefore, a pathway of leakage current 35 may be formed at the input end of the back-end buffer 34 and such a leakage current 35 can result in gradual leakage of charge stored in the tracking capacitor 33, accordingly undesirable reduction of the voltage level. The influence of droop error on the output waveform is illustrated as reference number 38 in FIG. 3B.

Also, the third one is known as the hold mode feedthrough (HMF) effect. From its transduction pathway shown in FIG. 3A, it can be observed that such an error appears because, as the switch 31 performing the disconnect operation, the clock signal passes through the pathway of the stray capacitor 36 and couples to the sampling capacitor 33 used for signal storage, thus affecting the amount of charge stored in the sampling capacitor 33. The influence of hold mode feedthrough error on the output waveform is illustrated as reference number 39 in FIG. 3B. The reason that such an effect may occur is because a stray capacitor 36 exists between the input end and the output end of the component; hence, as the switch 31 disconnects, the input signal is not completely isolated, but rather couples to the output end of the switch 31 through the stray capacitor 36, further affecting the charge stored in the sampling capacitor 33 and accordingly resulting in distortion in THA output; therefore, the HMF issue is actually the most crucial factor that affects the resolution of THA.

In addition, currently the hold circuits concerning double sampling all apply CMOS processes, but one significant drawback caused by such CMOS processes is inoperability under high-speed state, and the amplitude of input/output signal is thus adversely restricted. As such, in order to successfully apply the hold circuit featuring double sampling under high-speed state, it is possible to use the double sampling method to reduce the complexities in designing the sampling circuit and the output buffer inside the high-speed track-and-hold amplifier circuit thereby increasing the effective sampling rate to two times; meanwhile, it is possible as well to adopt the linearization technology to enhance the linearity of the input buffer such that the dynamic response of the integral BiCMOS track-and-hold amplifier circuit can be improved. In this way an optimal solution can be achieved.

SUMMARY OF THE INVENTION

An objective of the present invention is to provide a high-speed BiCMOS double sampling track-and-hold amplifier circuit which can use the approach of double sampling to reduce complexities in designing the sampling circuit and the output buffer within the BiCMOS track-and-hold amplifier circuit, thereby increasing the effective sampling rate to two times.

Another objective of the present invention is to provide a high-speed BiCMOS double sampling track-and-hold amplifier circuit which can employ the linearization technology to enhance the linearity of the input buffer inside the BiCMOS double sampling track-and-hold amplifier circuit in order to improve the dynamic response of the integral BiCMOS double sampling track-and-hold amplifier circuit.

A high-speed BiCMOS double sampling track-and-hold amplifier circuit capable of achieving the aforementioned objectives of the present invention comprises an input buffer including an input end and an output end; two front-end switches, each including a forward toggle and a backward toggle; two sampling capacitors; two intermediate buffers, each including an input end and an output end; two feedback buffers, each including an input end and an output end; two back-end switches, each including a forward toggle and a backward toggle; and an output buffer including an input end and an output end. The present invention uses the aforementioned components to form a hold circuit capable of BiCMOS double sampling, wherein an end of each of the two forward toggle is coupled to the output end of the input buffer, and the other end of the forward toggle is coupled to an end of the backward toggle.

In addition, an end of the sampling capacitor is coupled to the junction of the forward toggle in the front-end switch and the backward toggle in the front-end switch, and the other of the sampling capacitor is coupled to ground; the input end of the intermediate buffer is coupled to the junction of the sampling capacitor and the front-end switch; also, the input end of the feedback buffer is coupled to the output end of the intermediate buffer and the output end of the feedback buffer is coupled to the other end of the backward toggle in the front-end switch.

Furthermore, an end of the forward toggle of the back-end switch and an end of the backward toggle of the back-end switch are conjunctively coupled to the junction of the intermediate buffer and the feedback buffer, while the input end of the output buffer is coupled to the other end of the forward toggle in the two back-end switches.

More specifically, the first front-end switch among said two front-end switches receives a first clock signal and the second front-end switch receives a second clock signal; besides, the first back-end switch corresponding to the first front-end switch receives the second clock signal and the second back-end switch corresponding to the second front-end switch receives the first clock signal.

More specifically, when the first clock signal is "1", the forward toggle in the first front-end switch and the forward toggle in the second back-end switch become conductive, so the first sampling capacitor is charged through the output end of the input buffer; meanwhile, the charge stored in the second sampling capacitor is transferred to the output end of the output buffer by way of the second intermediate buffer, the second back-end switch and the output buffer.

More specifically, when the second clock signal is "1", the forward toggle in the first back-end switch and the forward toggle in the second front-end switch become conductive, so the second sampling capacitor is charged through the output end of the input buffer; meanwhile, the charge stored in the first sampling capacitor is transferred to the output end of the output buffer by way of the first intermediate buffer, the first back-end switch and the output buffer.

More specifically, the other end of the backward toggle in the first back-end switch is connected to a fixed voltage, so, when the first clock signal is "1" and the second clock signal is "0", the backward toggle in the first back-end switch becomes conductive, and the voltage at the junction of the first intermediate buffer and the first feedback buffer is retained to the fixed voltage.

More specifically, the other end of the backward toggle in the second back-end switch is connected to a fixed voltage, so, when the second clock signal is "1" and the first clock signal is "0", the backward toggle in the second back-end switch becomes conductive, and the voltage at the junction of the second intermediate buffer and the second feedback buffer is retained to the fixed voltage.

More specifically, when the first clock signal is "1" and the second clock signal is "0", the backward toggle in the second front-end switch becomes conductive, thus the voltage stored within the second sampling capacitor is fed back to the input end of the second intermediate buffer through the second intermediate buffer and the second feedback buffer.

More specifically, when the second clock signal is "1" and the first clock signal is "0", the backward toggle in the first front-end switch becomes conductive, thus the voltage stored within the first sampling capacitor is fed back to the input end of the first intermediate buffer through the first intermediate buffer and the first feedback buffer.

DETAILED DESCRIPTION OF THE PREFERRED EMBODIMENTS

The aforementioned and other technical contents, aspects and effects in relation with the present invention can be clearly appreciated through the detailed descriptions concerning the preferred embodiments of the present invention in conjunction with the appended drawings.

Figure 4:
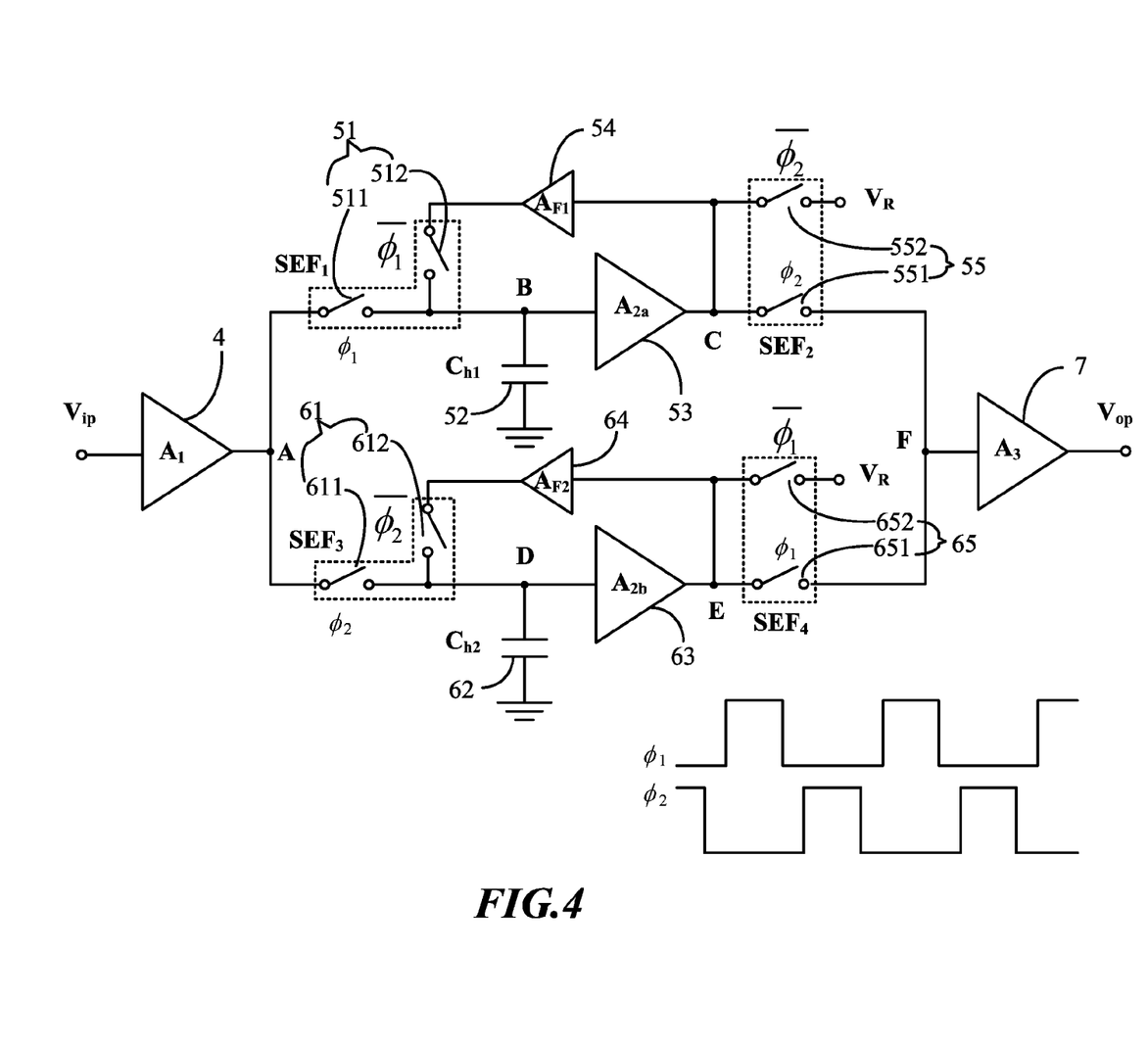
FIG. 4 shows a diagram for the architecture of a high-speed BiCMOS double sampling track-and-hold amplifier circuit according to the present invention.

Refer now to FIG. 4, wherein a diagram for the architecture of a high-speed BiCMOS double sampling track-and-hold amplifier circuit according to the present invention is shown. From the Figure, it can be seen that the illustrated high-speed BiCMOS double sampling track-and-hold amplifier circuit comprises an input buffer 4 including an input end and an output end; two front-end switches 51, 61, each including a forward toggle and a backward toggle; two sampling capacitors 52, 62; two intermediate buffers 53, 63, each including an input end and an output end; two feedback buffers 54, 64, each including an input end and an output end; two back-end switches 55, 65, each including a forward toggle and a backward toggle; and an output buffer 7 including an input end and an output end.

The present invention uses the aforementioned components to constitute a hold circuit featuring BiCMOS double sampling, wherein an end of the forward toggle 511, 611 in the two front-end switch 51, 61 is coupled to the output end of the input buffer 4, and the other end of the forward toggle 511, 611 in the front-end switch 51, 61 is coupled to an end of the backward toggle 512, 612. Also, an end of the sampling capacitor 52, 62 is coupled to the junction of the forward toggle 511, 611 and the backward toggle 512, 612 in the front-end switch 51, 61, and the other of the sampling capacitor 52, 62 is coupled to ground; the input end of the intermediate buffer 53, 63 is coupled to the junction of the sampling capacitor 52, 62 and the front-end switch 51, 61.

Meanwhile, the input end of the feedback buffer 54, 64 is coupled to the output end of the intermediate buffer 53, 63 and the output end of the feedback buffer 54, 64 is coupled to the other end of the backward toggle 512, 612 in the front-end switch 51, 61; furthermore, an end of the forward toggle 551, 651 of the back-end switch 55, 65 and an end of the backward toggle 552, 652 of the back-end switch 55, 65 are conjunctively coupled to the junction of the intermediate buffer 53, 63 and the feedback buffer 54, 64, while the input end of the output buffer 7 is coupled to the other end of the forward toggle 551, 651 in the two back-end switches 55, 65.

In order to further illustrate the principle of the embodiments according to the present invention in details, it is assumed that the voltage gains provided by the input buffer 4, the intermediate buffer 53, 63, the feedback buffer 54, 64 and the output buffer 7 are all "1", and that the first front-end switch 51 among the two front-end switches receives a first clock signal $\phi_1$ and the second front-end switch 61 receives a second clock signal $\phi_2$. Also, the first back-end switch 55 corresponding to the first front-end switch 51 receives the second clock signal $\phi_2$ and the second back-end switch 65 corresponding to the second front-end switch 61 receives the first clock signal $\phi_1$.

Figure 5:
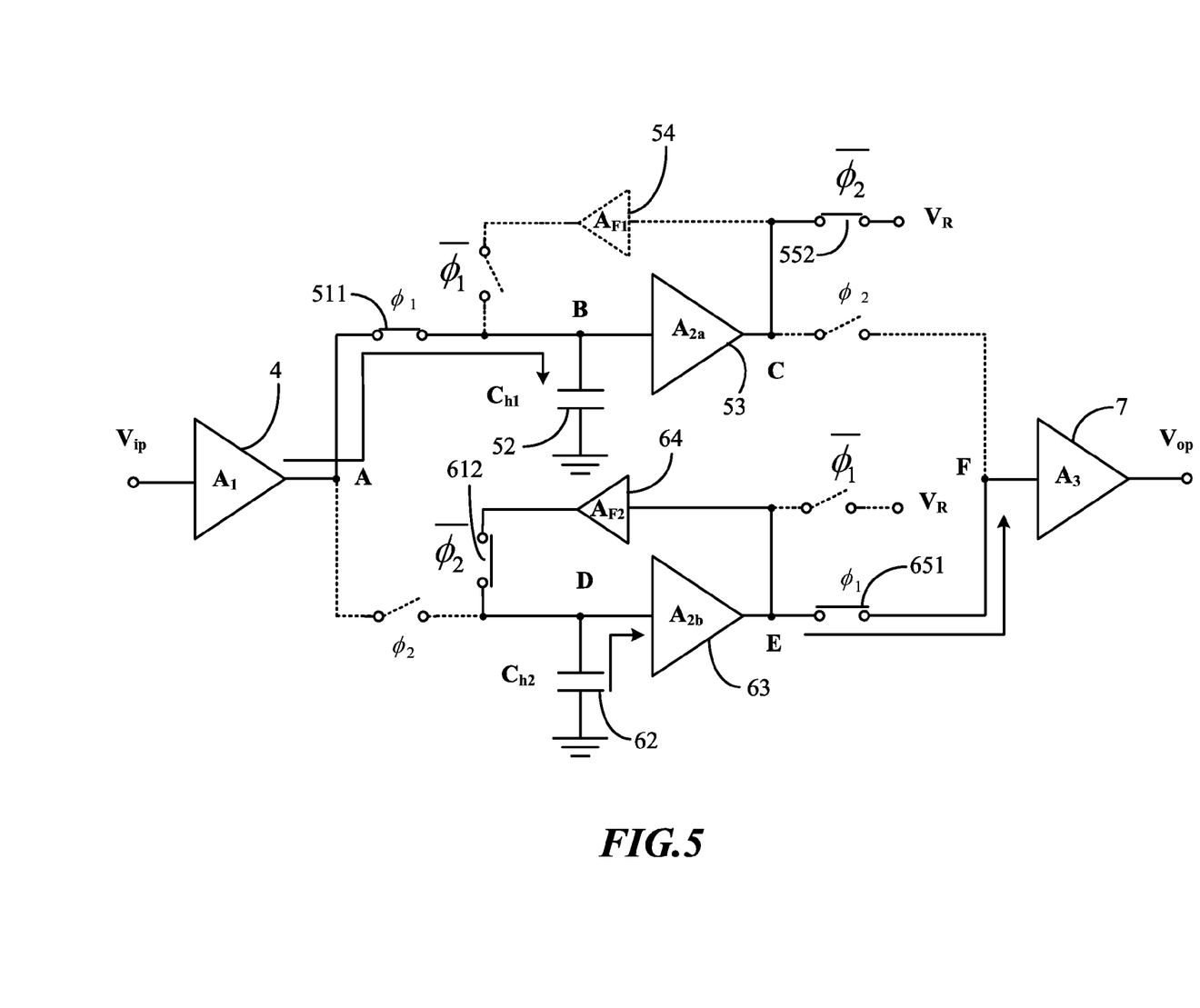
FIG. 5 shows a diagram for the embodiment principle of the high-speed BiCMOS double sampling track-and-hold amplifier circuit according to the present invention.

As shown in FIG. 5, when the first clock signal $\phi_1$ ascends to "1", it causes the upper section of the circuit to operate under the sampling mode, wherein the forward toggle 511 in the first front-end switch 51 and the forward toggle 651 in the second back-end switch 65 become conductive, so the first sampling capacitor 52 is charged by the output end of the input buffer 4 ($V_B=V_{ip}(\phi_1)$); on the other hand, when the first clock signal $\phi_1$ ascends to "1", the lower section of the circuit operates under the hold mode, wherein the electrical charge stored in the second sampling capacitor 62 is transferred to the output end of the output buffer 7 by way of the second intermediate buffer 63, the second back-end switch 65 and the output buffer 7.

Figure 6:
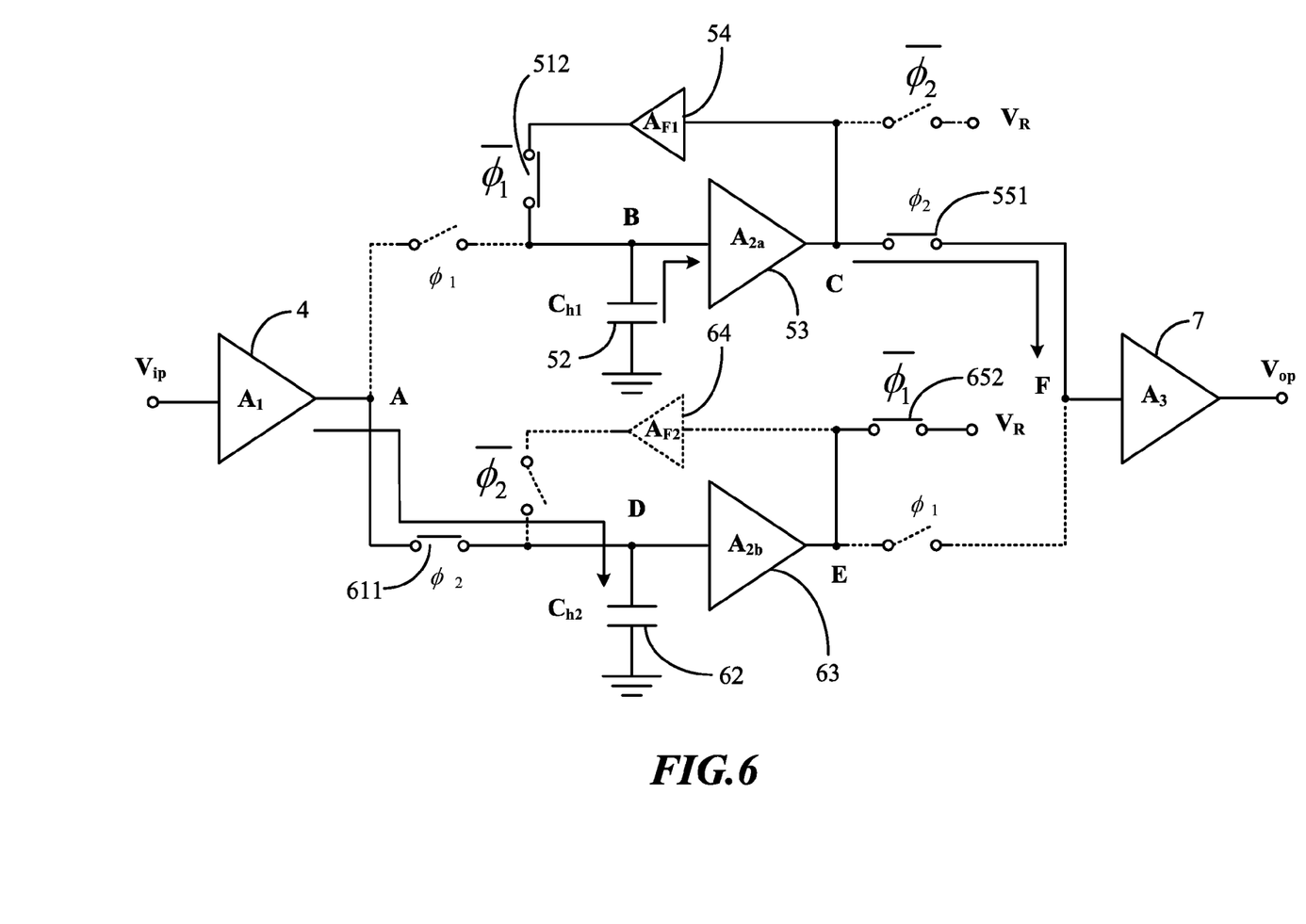
FIG. 6 shows a diagram for the embodiment principle of the high-speed BiCMOS double sampling track-and-hold amplifier circuit according to the present invention.

Contrarily, as shown in FIG. 6, in case that the second clock signal $\phi_2$ ascends to "1", the lower section of the circuit operates under the sampling mode (analogously the upper second of the circuit alters to operate under the hold mode), wherein the forward toggle 551 in the first back-end switch 55 and the forward toggle 611 in the second front-end switch 61 become conductive, consequently the second sampling capacitor 62 is charged by the output end of the input buffer 4 ($V_D=V_{ip}(\phi_2)$); meanwhile, the electrical charge stored in the first sampling capacitor 52 is transferred to the output end of the output buffer 7 by way of the first intermediate buffer 53, the first back-end switch 55 and the output buffer 7.

Figure 7:
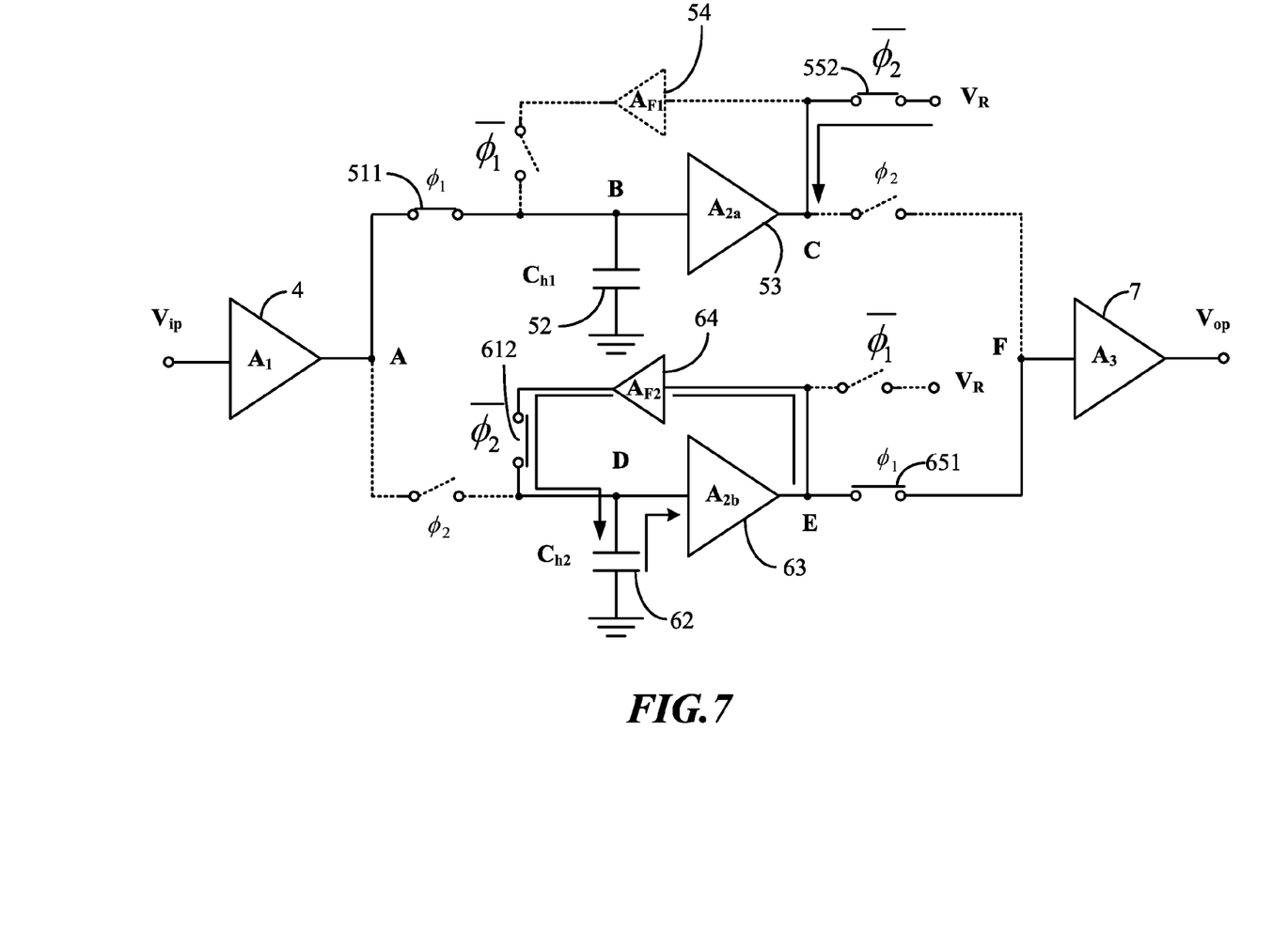
FIG. 7 shows a diagram for the embodiment principle of the high-speed BiCMOS double sampling track-and-hold amplifier circuit according to the present invention.

Furthermore, in order to resolve the issue of hold mode feedthrough (HMF), as shown in FIG. 7, when the first clock signal $\phi_1$ ascends to "1", the second clock signal $\phi_2$ is "0", then the backward toggle 612 in the second front-end switch 61 becomes conductive, and the node voltage $V_C$ is retained to a fixed voltage $V_R$; besides, the node voltage $V_D$ is retained to such a voltage $V_D$ because that, due to the feedback effect, the voltage stored in the second sampling capacitor 62 is fed back to the input end of the second intermediate buffer 63 through the second intermediate buffer 63 and the second feedback buffer 64. That is, when the switch is closed, the input end of the switch is maintained at a fixed voltage thereby effectively suppressing the HMF effect.

Figure 8:
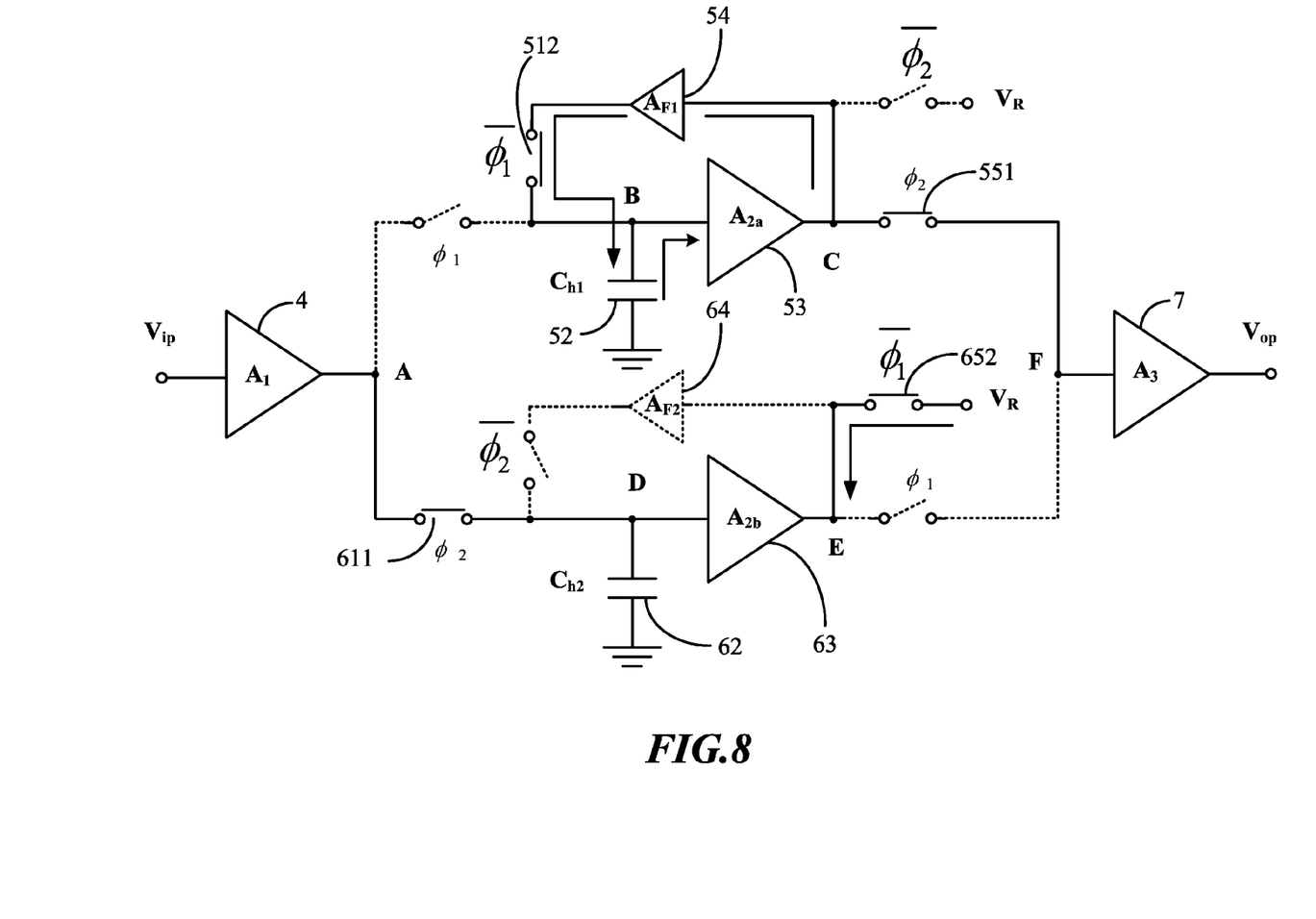
FIG. 8 shows a diagram for the embodiment principle of the high-speed BiCMOS double sampling track-and-hold amplifier circuit according to the present invention.

Analogously, as shown in FIG. 8, when the second clock signal $\phi_2$ ascends to "1", the first clock signal $\phi_1$ is "0", so the backward toggle 652 in the second back-end switch 65 becomes conductive, and the node voltage $V_E$ is retained to a fixed voltage $V_R$; in addition, the node voltage $V_B$ can be retained to the voltage previously stored in the first sampling capacitor 52 because that, due to the feedback effect, the voltage stored in the first sampling capacitor 52 is fed back to the input end of the first intermediate buffer 53 through the first intermediate buffer 53 and the first feedback buffer 54. As such, when the switch is OFF, the input end of the switch is maintained at a fixed voltage thereby effectively suppressing the HMF effect.

Figure 9:
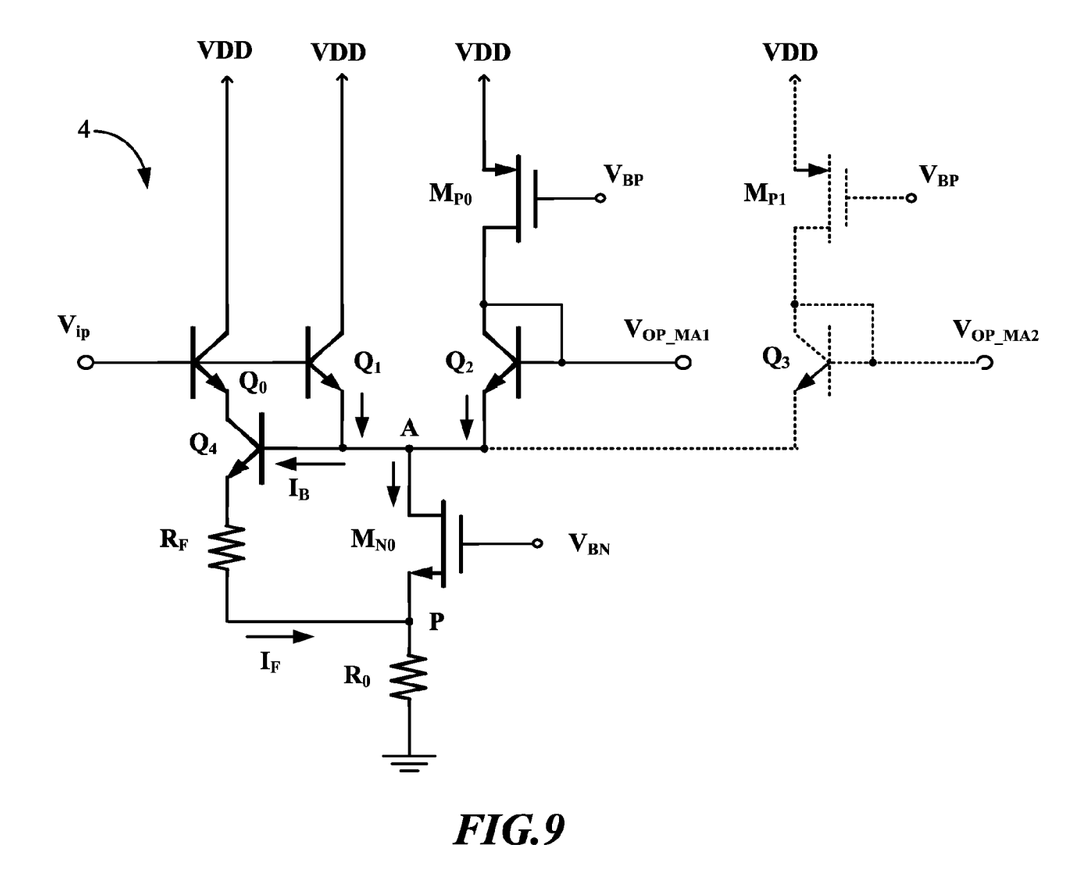
FIG. 9 shows a circuit diagram for an embodiment of input buffer in the high-speed BiCMOS double sampling track-and-hold amplifier circuit according to the present invention.

To further set forth the contents of the present invention in details, embodiments according to the present invention are hereunder illustrated. FIG. 9 shows a circuit diagram for an embodiment of a unity-gain input buffer. The illustrated input buffer 4 acts as the input end of the track-and-hold amplifier circuit, and, in the input end, the current sources $M_{P0}$-$M_{P1}$ and the transistors $Q_1$-$Q_2$ conjunctively form a level-shifter circuit, the transistors $Q_0$, $Q_4$ and the resistor $R_F$ constitute a linear compensation circuit, and additionally the transistor $M_{N0}$ and resistor $R_0$ together make up a fixed current source so as to provide the $Q_1$ and $Q_2$ with required electrical current. Meanwhile, the two output ends and of the input buffer are respectively connected to the upper section and the lower section of the track-and-hold amplifier circuit.

In this way, when the input signal $V_{ip}$ arises, the emitter current passing through the transistor $Q_1$ increases because the current provided by the current source $M_{N0}$ is of fixed value; comparatively, the emitter current passing through the transistor $Q_2$ decreases. Additionally, since $I_{E\_Q_1}$ is not equal to $I_{E\_Q_2}$, distortions may occur; that is, $V_{ip} \neq V_{OP\_MA1}$. With regards to such an issue, it is possible to use a linear compensation circuit as an effective solution; in other word, considering that, when the input signal $V_{ip}$ goes up, the emitter current of the transistor $Q_0$ increases and the increased emitter current flows through the resistor $R_0$ such that the node voltage $V_P$ elevates thereby reducing the value of total electrical current $I_{DS\_MN0}$. Upon the input signal $V_{ip}$ rising up, the total electrical current $I_{DS\_MN0}$ decreases, so the previous increase in the emitter current of $Q_1$ will be cancelled by the decrease in the total electrical current, accordingly leading to reduction in current $I_{E\_Q_1}$, and the current $I_{E\_Q_1}$ will be equal to $I_{E\_Q_2}$. Consequently, it is possible to effectively compensate the linearity in the input buffer 4 by means of the backward feedback effect.

Figure 10:
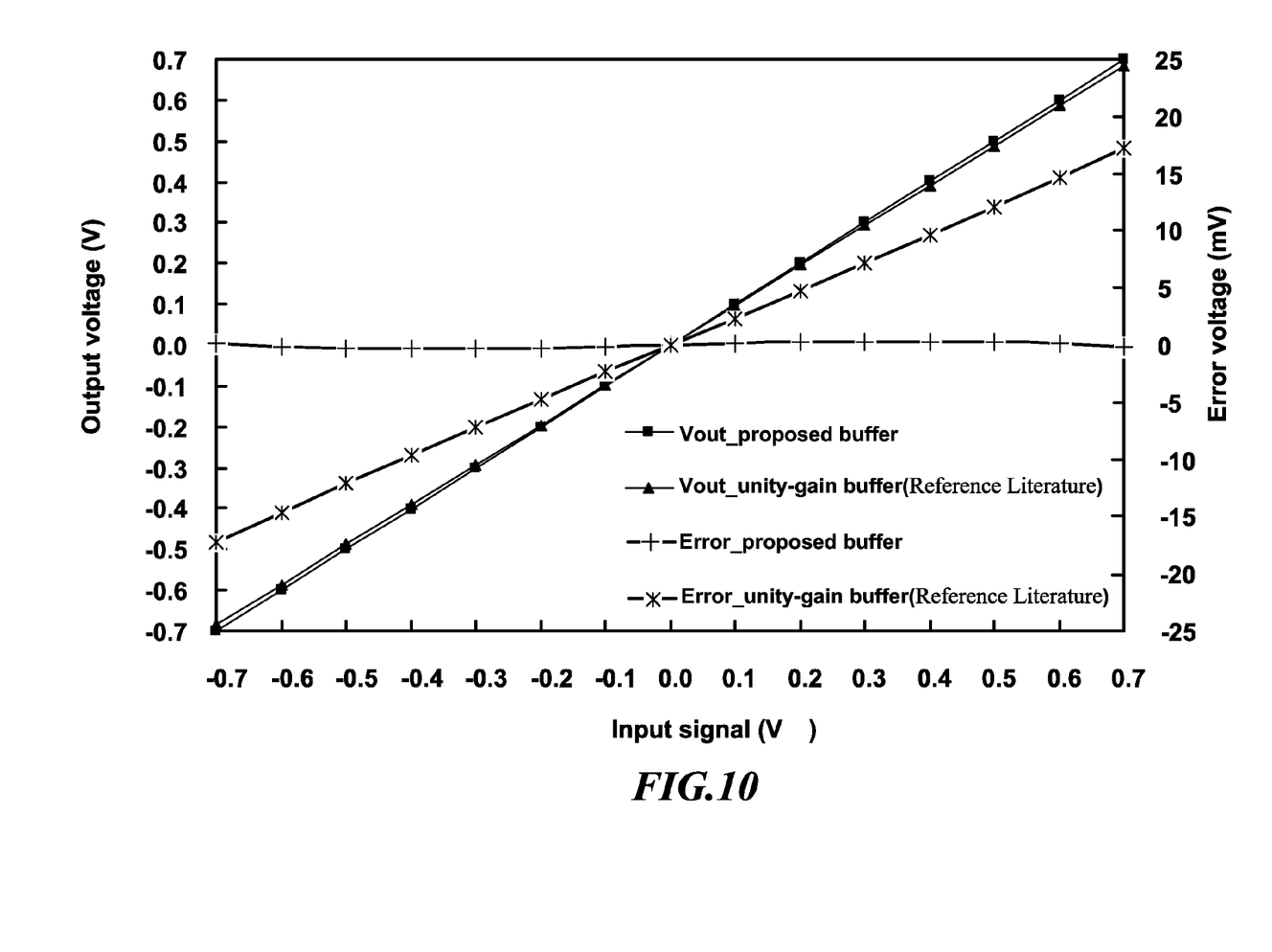
FIG. 10 shows a diagram for linearity simulation results of an input buffer in the high-speed BiCMOS double sampling track-and-hold amplifier circuit according to the present invention.

To examine the linearity in the input buffer 4 according to the present invention, the input buffer of the present embodiment is compared with the counterpart illustrated in the reference literature (e.g., C. Fiocchi, U. Gatti, and F. Maloberti, "*Design issue on high-speed high-resolution track-and-holds in BiCMOS technology*," IEEE Proc. Circuits Device and Syst., vol. 147, no. 2, pp. 100-106, April 2000.), as shown in FIG. 10. To more specifically describe the advantages provided by the input buffer of the present embodiment, an error voltage parameter $\Delta V_e = V_{out\_ideal} - V_{out}$ is herein defined for representing the difference calculated based on the ideal value of the circuit output voltage minus the actual value.

Finally, as can be seen from FIG. 10, the values acquired through the error voltage parameter $\Delta V_e$ of the input buffer 4 according to the present embodiment are all advantageously less than the ones obtained by means of the input buffer illustrated in the reference literature. Besides, the maximum error voltage parameter $\Delta V_e$ for the input buffer 4 of the present embodiment is ±0.33 mV, while the maximum error voltage parameter $\Delta V_e$ of the input buffer set forth in the reference literature is ±17.25 mV.

Figure 11:
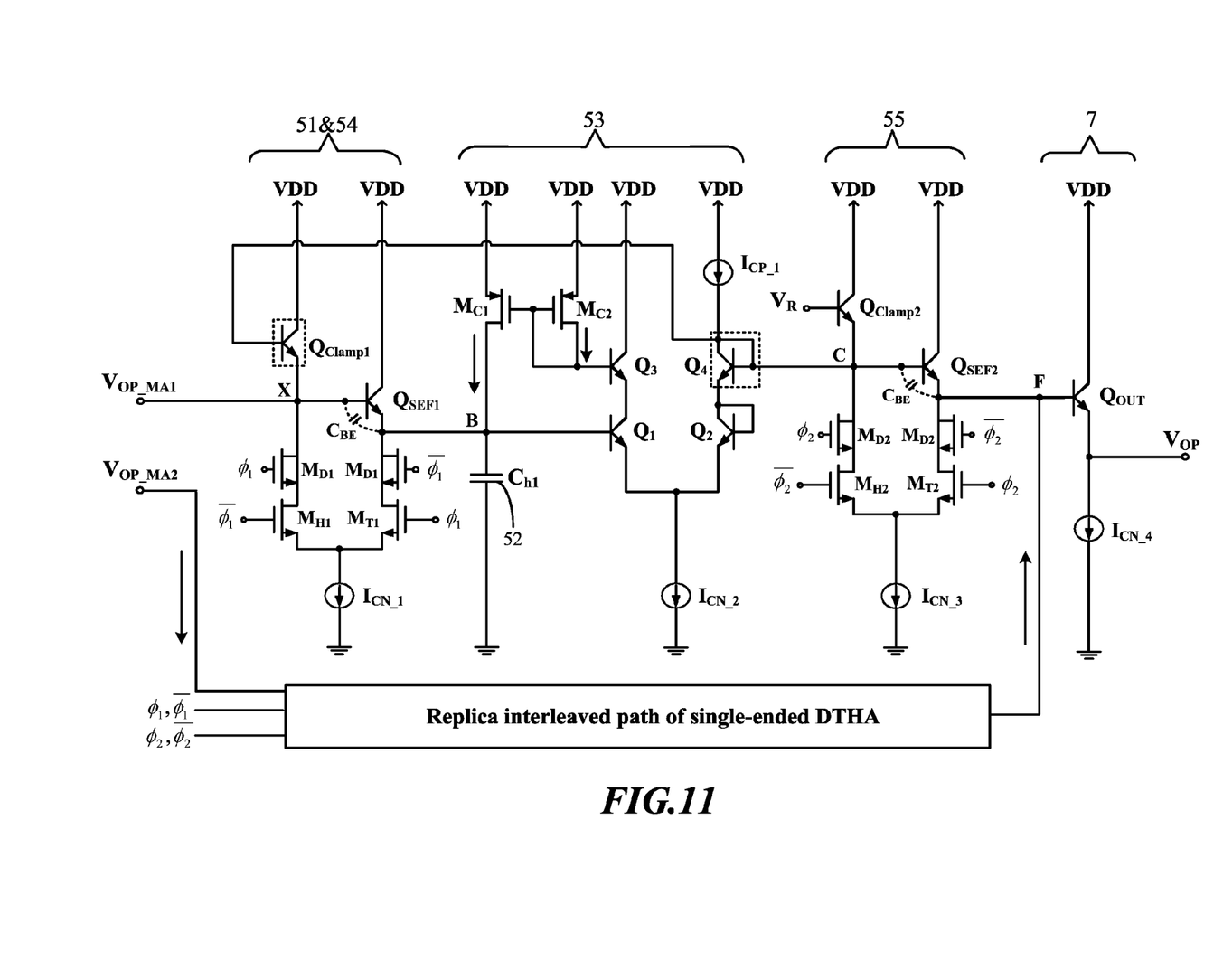
FIG. 11 shows a circuit diagram for a partial embodiment of the high-speed BiCMOS double sampling track-and-hold amplifier circuit according to the present invention.

Refer next to FIG. 11, wherein a circuit diagram for a partial embodiment of a high-speed BiCMOS double sampling track-and-hold amplifier circuit according to the present invention is shown. Since the architectures in the upper section and the lower section are identical, only the circuit diagram for the upper section of the embodiment is herein provided for brevity. The present embodiment generally comprises a front-end switch 51, a first sampling capacitor 52 ($C_{h1}$), a first intermediate buffer 53 ($A_{2a}$), a first feedback buffer 54 ($A_{F1}$), a first back-end switch 55 and an output buffer 7 ($A_3$).

The present embodiment employs the emitter follower to constitute the first front-end switch 51 and the first back-end switch 55, wherein the first front-end switch 51 is controlled by two current toggles $M_{T1}$ and $M_{H1}$ for conductivity state, and the first back-end switch 55 is similarly controlled through two current toggles $M_{T2}$ and $M_{H2}$ for conductivity state. When the current toggle $M_{T1}$ operates in conductivity, the first front-end switch 51 operates under the track mode; on the other hand, when the toggle $M_{H1}$ operates in conductivity, the first front-end switch 51 operates under the hold mode. Therefore, when the first front-end switch 51 operates under the track mode, the first back-end switch 55 operate under the hold mode, thereby achieving the function of time interleaved switching.

In addition, the first intermediate buffer 53 is formed by transistors $Q_1$-$Q_4$ which together make up a unity-gain level shifter; whereas the output buffer 7 is implemented by means of the emitter follower.

Each of the two current toggles $M_{T1,2}$ and $M_{H1,2}$ in every switch includes a dummy transistor $M_{D1,2}$. This dummy transistor is used for suppression of pedestal error effect. Since the drive clock for the dummy transistor is opposite to the drive clock for the current toggle and the length of the dummy transistor is half of the current toggle, it is capable of cancelling the stray capacitor $C_{GD}$ when the clock signal passes through the current toggle and matches the value of the storage capacitor $C_{h1}$.

With regards to the non-ideal droop error, the present embodiment uses current mirrors $M_{C1}$ and $M_{C2}$ for the purpose of compensation. It can be seen in FIG. 11 that the electrical currents passing through the transistors $Q_1$ and $Q_2$ from a power source VDD are largely equal, so both of them have the equivalent base current. Consequently, the base current flowing through $Q_2$ will be duplicated by the transistor $M_{C2}$ of the current mirrors and such a current can replenish the current lost due to the base current of the transistor $Q_1$ thereby compensating the droop error.

The third non-ideal effect to be compensated is HMF, and the present embodiment applies two clamp transistors $Q_{clamp2}$ and $Q_{clamp1}$ to compensate such a non-ideal effect. In FIG. 11, it is shown that, when the first back-end switch 55 is closed (i.e., $\overline{\phi_2}$='1'), the transistor $Q_{clamp2}$ becomes conductive and the node voltage $V_C = V_R - V_{BE\_Q_{clamp2}}$, so the input end of the first back-end switch 55 is retained to a fixed voltage.

On the other hand, when the first front-end switch 51 is closed (i.e., $\overline{\phi_1}$='1'), the transistor $Q_{clamp1}$ becomes conductive and the node voltage $V_X$ is retained to a fixed voltage value which originates from the node voltage $V_B$ along the feedback pathway and sequentially through the transistors $Q_1, Q_2, Q_4, Q_{clamp1}$, accordingly $V_X = V_B$. From the aforementioned descriptions, it can be appreciated that when either one of the first front-end switch 51 or the first back-end switch 55 is closed, the corresponding input end is always kept at a fixed voltage thus effectively suppressing the HMF effect.

Figure 12:
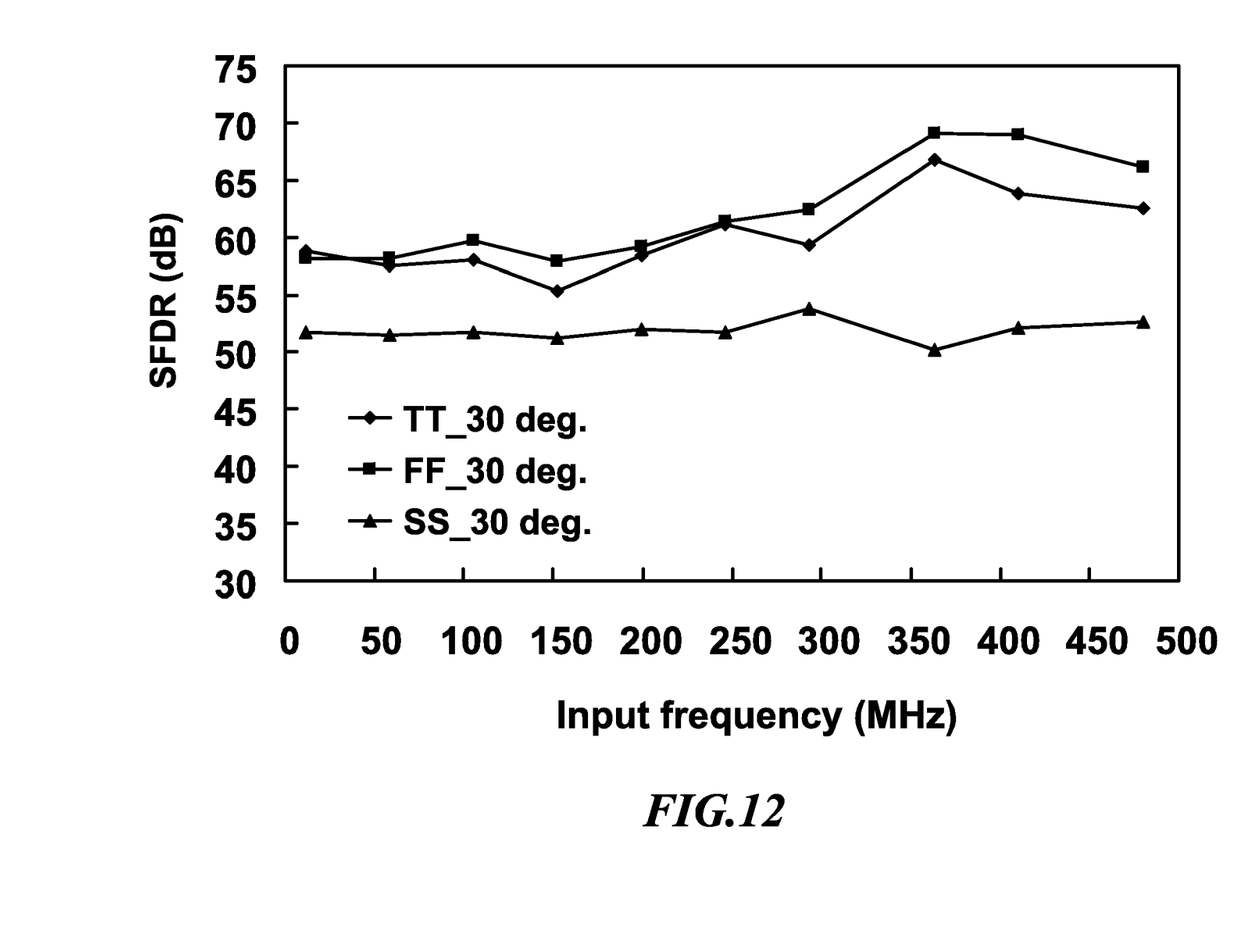
FIG. 12 shows a diagram for SFDR dynamic simulation results of the high-speed BiCMOS double sampling track-and-hold amplifier circuit according to the present invention.

Refer next to FIG. 12, wherein SFDR dynamic simulation results for a high-speed BiCMOS double sampling track-and-hold amplifier circuit according to the present invention are shown. The Figure illustrates the SFDR (Spurious-Free Dynamic Range) dynamic simulation results, and in the present embodiment the sampling frequency is set to be 1 GHz (equivalent to two times of 500 MHz sampling frequency), with the input frequency ranging from 100 MHz to 500 MHz. From the Figure, it is concluded that the Effective Number of Bits (ENOB) for the circuit of the present embodiment can achieve 9-bit.

Compared with prior art, the high-speed BiCMOS double sampling track-and-hold amplifier circuit provided by the present invention can offer the following advantages:
1. the present invention applies the approach of double sampling to reduce complexities in designing the sampling circuit and the output buffer within the BiCMOS track-and-hold amplifier circuit thereby increasing the effective sampling rate to two times;
2. the present invention employs the linearization technology to enhance the linearity of the input buffer inside the BiCMOS double sampling track-and-hold amplifier circuit in order to improve the dynamic response of the integral BiCMOS double sampling track-and-hold amplifier circuit.

By way of the aforementioned detailed descriptions for the preferred embodiments according to the present invention, it is intended to better illustrate the characters and spirit of the present invention rather than restricting the scope of the present invention to the preferred embodiments disclosed in the previous texts. Contrarily, the objective is to encompass all changes and effectively equivalent arrangements within the scope of the present invention as delineated in the following claims of the present application.

What is claimed is:
1. A high-speed BiCMOS double sampling track-and-hold amplifier circuit, comprising:
an input buffer, including an input end and an output end;
two front-end switches, each including a forward toggle and a backward toggle, wherein an end of the forward toggle is coupled to the output end of the input buffer, and the other end of the forward toggle is coupled to an end of the backward toggle;

two sampling capacitors, wherein an end of the sampling capacitor is coupled to the junction of the forward toggle in the front-end switch and the backward toggle in the front-end switch, while the other of the sampling capacitor is coupled to ground;

two intermediate buffers, each including an input end and an output end, wherein the input end of the intermediate buffer is coupled to the junction of the sampling capacitor and the front-end switch;

two feedback buffers, each including an input end and an output end, wherein the input end of the feedback buffer is coupled to the output end of the intermediate buffer and the output end of the feedback buffer is coupled to the other end of the backward toggle in the front-end switch;

two back-end switches, each including a forward toggle and backward toggle, wherein an end of the forward toggle and an end of the backward toggle are conjunctively coupled to the junction of the intermediate buffer and the feedback buffer; and an output buffer, including an input end and an output end, wherein the input end is coupled to the other end of the forward toggle in the two back-end switches.

2. The high-speed BiCMOS double sampling track-and-hold amplifier circuit according to claim 1, wherein the first front-end switch among the two first front-end switches receives the first clock signal and the second front-end switch receive the second clock signal.

3. The high-speed BiCMOS double sampling track-and-hold amplifier circuit according to claim 2, wherein the first back-end switch corresponding to the first front-end switch receives the second clock signal and the second back-end switch corresponding to the second front-end switch receives the first clock signal.

4. The high-speed BiCMOS double sampling track-and-hold amplifier circuit according to claim 3, wherein, when the first clock signal is "1", the forward toggle in the first front-end switch and the forward toggle in the second back-end switch become conductive, so the first sampling capacitor is charged through the output end of the input buffer; meanwhile, the charge stored in the second sampling capacitor is transferred to the output end of the output buffer by way of the second intermediate buffer, the second back-end switch and the output buffer.

5. The high-speed BiCMOS double sampling track-and-hold amplifier circuit according to claim 3, wherein, when the second clock signal is "1", the forward toggle in the first back-end switch and the forward toggle in the second front-end switch become conductive, so the second sampling capacitor is charged through the output end of the input buffer; meanwhile, the charge stored in the first sampling capacitor is transferred to the output end of the output buffer by way of the first intermediate buffer, the first back-end switch and the output buffer.

6. The high-speed BiCMOS double sampling track-and-hold amplifier circuit according to claim 3, wherein the other end of the backward toggle in the first back-end switch is connected to a fixed voltage, so, when the first clock signal is "1" and the second clock signal is "0", the backward toggle in the first back-end switch becomes conductive, and the voltage at the junction of the first intermediate buffer and the first feedback buffer is retained to the fixed voltage.

7. The high-speed BiCMOS double sampling track-and-hold amplifier circuit according to claim 3, wherein the other end of the backward toggle in the second back-end switch is connected to a fixed voltage, so, when the second clock signal is "1" and the first clock signal is "0", the backward toggle in the second back-end switch becomes conductive, and the voltage at the junction of the second intermediate buffer and the second feedback buffer is retained to the fixed voltage.

8. The high-speed BiCMOS double sampling track-and-hold amplifier circuit according to claim 3, wherein, when the first clock signal is "1" and the second clock signal is "0", the backward toggle in the second front-end switch becomes conductive, therefore the voltage stored within the second sampling capacitor is fed back to the input end of the second intermediate buffer through the second intermediate buffer and the second feedback buffer.

9. The high-speed BiCMOS double sampling track-and-hold amplifier circuit according to claim 3, wherein, when the second clock signal is "1" and the first clock signal is "0", the backward toggle in the first front-end switch becomes conductive, therefore the voltage stored within the first sampling capacitor is fed back to the input end of the first intermediate buffer through the first intermediate buffer and the first feedback buffer.

* * * * *